United States Patent [19]

Yamada et al.

[11] Patent Number: 4,975,392

[45] Date of Patent: Dec. 4, 1990

[54] METHOD FOR MANUFACTURING SILICON CARBIDE WHISKER

[75] Inventors: Motoyuki Yamada; Kazutoshi Numanami; Takahiro Iizuka; Akira Hayashida, all of Joetsu, Japan

[73] Assignee: Shin-Etsu Chemical Co., Ltd., Tokyo, Japan

[21] Appl. No.: 439,276

[22] Filed: Nov. 20, 1989

[30] Foreign Application Priority Data

Nov. 18, 1988 [JP] Japan .................... 63-293221

[51] Int. Cl.$^5$ .................................. C04B 35/56
[52] U.S. Cl. ........................... 501/88; 501/95; 501/99; 423/345; 423/346; 264/57
[58] Field of Search ............... 423/345, 346; 501/88, 501/90, 95; 264/63, 60, 57

[56] References Cited

U.S. PATENT DOCUMENTS

| | | | |
|---|---|---|---|
| 4,500,504 | 2/1985 | Yamamoto | 423/345 |
| 4,536,379 | 8/1985 | Carlson et al. | 423/345 |
| 4,702,901 | 10/1987 | Shalek | 423/346 |
| 4,873,070 | 10/1989 | Kaji et al. | 423/345 |
| 4,908,340 | 3/1990 | Frechette et al. | 501/95 |

FOREIGN PATENT DOCUMENTS

| | | | |
|---|---|---|---|
| 2909104 | 9/1979 | Fed. Rep. of Germany | 423/345 |
| 48-19499 | 3/1973 | Japan | 423/345 |
| 2116533 | 1/1983 | United Kingdom | 423/345 |

*Primary Examiner*—William R. Dixon, Jr.
*Assistant Examiner*—Alan Wright
*Attorney, Agent, or Firm*—McAulay Fisher Nissen & Goldberg

[57] ABSTRACT

A method for manufacturing silicon carbide whisker which has a cross-sectional diameter of greater than about 1 μm by mixing a source of silicon atom in the form of grains having a mean grain diameter of at least 50 μm with a carbon atom source in the presence of an element or compound of the element, the element being yttrium, calcium, manganese, aluminum, indium, or rare earth elements in an amount from about 100 to 2,000 ppm and growing the silicon carbide whisker therefrom.

18 Claims, No Drawings

METHOD FOR MANUFACTURING SILICON CARBIDE WHISKER

BACKGROUND OF THE INVENTION

1. Field of the Invention

The present invention relates to a method for manufacturing silicon carbide whisker, and more particularly to a method for manufacturing silicon carbide whisker having a diameter of no shorter than 1 μm

2. Description of the Prior Art

Silicon carbide whisker, being superior to other fibers that are used to make composite materials in strength, elasticity, oxidation resistance, heat resistance, and chemical stability, is attracting a great deal of attention as a composite reinforcement material for ceramics, metals, plastics, etc.

The role expected of silicon carbide whisker in a composite material of which the matrix is either a metal or a plastic resin is to improve the strength, elasticity, and abrasion resistance; whereas the primary effect expected from admixing silicon carbide whisker in a ceramic material is to improve the fracture toughness of the ceramic composite material so that it has a high resistance to breakage.

One of the most important features that are required of whiskers for reinforcing ceramic composite materials is the thickness of the whisker, that is, the mean diameter of the cross section of the whisker. The greater the diameter of the whisker, the greater the fracture toughness of the composite material reinforced by the whisker. Hence, a whisker ought to have a sufficiently large cross-sectional diameter so that a crack caused in the resultant composite material fails to break the whiskers and thus does not develop extensively. For this reason, it is desirable that a silicon carbide whisker used in a ceramic composite material has an average cross-sectional diameter not smaller than 1 μm.

Four methods have been known for manufacturing silicon carbide whisker: (A) crystallizing a whisker from a liquefied silicon carbide under conditions of high temperature and high pressure; (B) dissolving carbon in a molten liquid of metallic silicon, and crystallizing a silicon carbide whisker; (C) crystallizing a whisker by sublimating silicon carbide from silicon carbide powder at a high temperature; and (D) crystallizing a silicon carbide whisker from silicon carbide obtained by means of a pyrolysis of a silicon compound.

Since methods (A) and (B) require extremely high temperatures and high pressures and employ molten metallic silicon, these methods must depend on highly sophisticated manufacturing facilities to avoid difficulty in controlling the manufacturing process. Method (C) also requires extremely high operation temperatures and the operation itself is difficult to control; furthermore the manufacturing facility is complicated and it is difficult to perform fractional collection of the manufactured whisker with precision. Therefore, all of the methods (A) to (C) are not practical for use on a commercial basis.

Currently, therefore, method (D) is predominantly adopted for manufacturing silicon carbide whisker. Variations of method (D) have been proposed. Among them are (1) a method whereby silicon dioxide undergoes a solid phase reduction by means of carbon or by means of metallic silicon and carbon; (2) a method whereby a mixture of a carbonaceous compound and an organic silicon compound or a carbonaceous compound and an inorganic silicon compound is gasified and heated to undergo a reaction; and (3) a method whereby vapor phase crystallization is effected as a reaction off a fluorine=containing silicate with carbon proceeds.

Variations (2) and (3), according to which silicon carbide whisker is grown in a vapor phase, are methods whereby it may be possible to obtain a whisker having a cross-sectional diameter of 1 μm or greater, if the reaction conditions are appropriately selected. However, in the variation (2), since the reaction takes place in the gas phase, the amount of silicon carbide whisker obtained per unit volume of the reaction chamber is extremely small; thus it is necessary to use a huge reaction chamber when the method is practiced on a commercial basis. What is more, since the reaction temperature is high, it is necessary to use a considerable amount of energy to keep the interior of the huge reaction chamber sufficiently hot. Another problem is that the reaction by-product is corrosive. Variation (3) consists of melting a fluorine-containing silicate, adding carbon to the melt to thereby cause deoxidation, and cooling the vapor emerging from the melt to thereby grow silicon carbide whisker. Like variation (2) this method also involves a gas phase reaction so that the same problems exist with variation (b 3) as with variation (2). Besides, since it is necessary to handle a large amount of molten salts, the type of materials appropriate for the manufacturing facility is greatly limited. Another problem with variation (3) is that the molten salts get in the silicon carbide whisker as impurities. Therefore, variation (3) is not a preferred method for making the silicon carbide whisker on a commercial basis.

On the other hand, variation (1), which comprises solid phase deoxidation, uses easily available silicon dioxide as the initial material, with this variation, it is possible to scale up the manufacturing facility without technical difficulties so that the manufacture of silicon carbide whisker on a commercial basis is practical. Studies have been conducted in an attempt to find appropriate sources of silicon atoms to be employed in variation (1). As the result, various sources have been proposed, such as, (a) the silicon fraction obtained from hulls of gramineous plants, (b) quartz sand, (c) shirasu and scrap glass, and (d) active silica having a high specific surface area, e.g., silica sol and silica gel.

L. Patric et al reported that chromium, aluminum, iron, cobalt, copper, silicon, and gold are effective catalysts for the reaction in variation (1) for manufacture of silicon carbide whisker. Proposals were made as to the effective catalysts including those mentioned above. For example, Japanese Kokoku 50-18479, Japanese Kokai 61-22000, and Japanese Kokai 63-159300 teach that besides these metals, effective catalysts include compounds of these metals, and transition metals, such as nickel, and compounds thereof.

However, with the variation (1), it is extremely difficult to obtain a silicon carbide whisker having a diameter greater than 1 μm no matter which one of silicon sources (a) through (d) may be used. If thick whisker of a diameter exceeding 1 μm is ever grown, it occurs only to a limited extent and only in such particular positions such as the surface portion of the raw material layer and gaps therein.

It is also important to reduce the amount of powdery silicon carbide which is created as a by-product together with the silicon carbide whisker. When the whisker contains excessive amount of powdery carbide, the resultant ceramic composite material will exhibit poor fracture toughness. Accordingly, silicon carbide whiskers containing an excessive amount of powdery silicon carbide are often not suitable as a composite reinforcing material for ceramics, metals and plastics. Furthermore, there has been a problem that the powdery products by-produced in the silicon carbide whiskers cannot be completely separated even by a separation method utilizing the difference in the oleophilic and hydrophilic properties or by means of centrifugal precipitation.

SUMMARY OF THE INVENTION

This invention was intended in view of the foregoing circumstances, and it is an object of the invention to provide a method for manufacturing high purity silicon carbide whiskers containing a reduced amount of powdery silicon carbide and having a cross-sectional diameter of 1 $\mu$m or greater, at a high production rate and at a reduced cost.

The inventors made earnest studies for attaining the foregoing objects, and discovered a method for manufacturing a high-purity silicon carbide whisker containing a reduced amount of powdery silicon carbide and having a cross-sectional diameter of 1 $\mu$m or greater, at a high production rate and at a reduced cost, using variation (1). More particularly, this is accomplished by using a silicon atom source in the form of grains having a mean diameter of 50 $\mu$m or greater, and adding to the silicon atom source/carbon mixture is added one or more element(s) or a compound thereof selected from the group consisting of yttrium, calcium, manganese, aluminum, indium, and rare earth elements, such that the amount of the selected element or the overall amount of the selected elements becomes 100-2000 ppm based on the silicon ingredient in the source of silicon atom.

The present inventors investigated the mechanism of creation and growth of whiskers, and, as a result, found out that in the formation of silicon carbide whisker from the reaction of a source of silicon atom with carbon, the physical contact between the silicon source and carbon is essential. As a result of the contact, the silicon source and carbon react with each other gasify or sublimate to initiate a solid-gas phase reaction or gas-gas phase reaction whereby whiskers are created and grown. The inventors further studied and found that, although, in the conventional practice, the source of silicon atom is prepared in the form of fine powder in order to obtain a high reaction yield, if the source of silicon atom is prepared in the form of granules having a larger diameter, the specific surface area decreases so that the amount of silicon atoms leaving the surface of the granule to participate in the reaction is reduced. As a result, the reaction proceeds at a lower rate and consequently, the diameter of the whisker formed is generally increased. In particular, it was empirically found that if the mean diameter of the silicon source granule is 50 $\mu$m or greater, the resultant silicon carbide whisker will effectively have a cross-sectional diameter of 1 $\mu$m or greater.

The inventors also studied the effects of the metallic catalysts on the whisker diameter. They found that yttrium, calcium, manganese, aluminum, indium, and for rare earth elements, such as, cerium, neodymium, and gadolinium are elements capable of promoting thickening of the whisker in the reaction system (1) described above. More particularly, the inventors recognized that if—in addition to preparing the source of silicon atom in the form of grains having a mean diameter of 50 $\mu$m or greater—yttrium, calcium, manganese, aluminium indium, or a rare earth element, such as, cerium, neodymium, and gadolinium is added to the reaction system (1) described above in an amount of 100 to 2000 ppm based on the amount of the silicon atom, it is possible to effectively obtain a whisker having a cross-sectional diameter of 1 $\mu$m or greater.

DETAILED DESCRIPTION OF THE INVENTION

The source of silicon atom usable in the method of the invention can be any silicon-containing solid material except those that liquefy at temperatures from 1400° to 1800° C. Preferably, quartz sand, silica gel, metallic silicon, molybdenum bisilicate, and the like are recommended. An essential feature of the invention lies in that the source of silicon atom is in the form of grain having a predetermined grain diameter; therefore, if the granule silicon source melts at the reaction temperature and loses its solidness, a phase change occurs from solid to liquid, and the effect of the invention is not obtained. The content of impurities which are not silicon or carbon in the silicon source should be minimum, for the impurities are liable to enter the silicon carbide whisker to thereby reduce the purity and thus the toughness of the whisker.

In view of the yield of the manufactured silicon carbide whisker, and in order to minimize the amount of powdery silicon carbide contained in the silicon carbide whisker, it was found effective to use as a source of silicon atom a product obtained by hydrolyzing one or more of silanes selected from chlorosilanes represented by the general formula:

where R is a hydrogen atom or a monovalent hydrocarbon group, and the subscript a is an integer such that $0 \leq a \leq 3$, and chlorodisilanes represented by the general formula:

where r is a hydrogen atom or a monovalent hydrocarbon group, and the subscript b is an integer such that $1 \leq b \leq 5$. Incidentally, these chlorosilanes and chlorodisilanes are conventionally manufactured or obtained as a by-product in the processes practiced in the silicone industry, and therefore are easily available and inexpensive materials. A further advantage of those materials is that they can be easily purified through distillation.

Examples of the chlorosilanes of the general formula $R_aSiCl_{4-a}$ include $CH_3SiCl_3$, $(CH_3)_2SiCl_2$, $(CH_3)_3SiCl$, $(CH_2=CH)SiCl_3$, $C_6H_5SiCl_3$, $HSiCl_3$, $H_2SiCl_2$, and $SiCl_4$. Examples of the chlorodisilanes of the general formula $R_bSi_2Cl_{6-b}$ include $(CH_3)Si_2Cl_5$, $(CH_3)_2Si_2Cl_4$, $(CH_3)_3Si_2Cl_3$, and $(C_6H_5)_3Si_2Cl_3$. These chlorosilanes and chlorodisilanes obtained through the conventional processes in the silicone industry are not without metal impurities, including those metals used as the metallic catalyst in the present invention. To facilitate precise control of the amount of catalytic metals in the reaction system, it is desired that, before being hydrolyzed to obtain the source of silicon atom, the adopted chlorosilanes and/or chlorodisilanes be stripped of the metallic impurities by methods such as simple distillation and fractional distillation.

The chlorosilanes and the chlorodisilanes as the starting silicon source materials are easily hydrolyzed when in either gaseous or liquefied form, they are brought in direct contact with water. This converts ≡Si—Cl portion in the chlorosilanes and the chlorodisilanes into the ≡Si—O— radical, and hydrolysis products of molecules consisting mainly of silicon and oxygen atoms are obtained. The resulting hydrolysis products thus obtained are subjected to a pH adjustment and drying operation, if necessary, before being sent to the subsequent manufacturing step.

The sources of silicon atom, according to the invention, are prepared in the form of grains, rather than fine powder, so as to reduce the specific surface of the silicon source materials thereby retarding the reaction rate. In order to obtain good results, the mean grain diameter of the silicon source materials is required to be 50 $\mu$m or greater. More preferably, the mean grain diameter is from 50 $\mu$m to 1000 $\mu$m, or even more preferably from 100 $\mu$m to 500 $\mu$m. If the mean grain diameter is smaller than 50 $\mu$m, the resulting whisker diameter becomes smaller than 1 $\mu$m. On the contrary, when the mean grain diameter of the silicon source materials exceeds 1000 $\mu$m, the reaction rate is excessively reduced and this may cause a deterioration in both productive efficiency and conversion of silicon into silicon carbide. Thus, the grain diameter should not exceed 1000 $\mu$m, and when it does, the silicon source grain should be pulverized. On the other hand, when the mean grain diameter of the silicon source materials is smaller than 50 $\mu$m, it is desired that the materials are granulated (or caked) to give rise a greater mean grain diameter of 50–1000 $\mu$m. Incidentally, when granulation is carried out, it is all right to use caking material to facilitate granulation, if necessary and as long as the caking material does not adversely affect the formation of whisker.

As a source of the carbon atom for use in the method of the invention, it is possible to employ carbon black such as acetylene black and furnace black, carbonaceous materials such as activated carbon and charcoal, or any material like phenolic resin, resorcinolic resin, anilineformaldehyde resin, and cresolic resin that can easily carbonize at high temperatures. Since the reaction of the invention takes place on the solid surface, it is desirable that the source of carbon is a powder which gives a high specific surface area. Therefore, it is more advisable to use high-specific-surface materials such as carbon black and powdery activated carbon.

The mixture of the sources of silicon atom and carbon atom is prepared by mixing them by means of a known procedure utilizing machines such as a V-type mixer or a paddle-type mixer. It is desirable that the two sources are extensively mixed, for the more uniformly the substances are mixed, the greater the yield will be.

According to the invention, the concentration of the element selected from the group consisting of yttrium, calcium, manganese, aluminum, indium, and rare earth elements (e.g., cerium, neodymium, gadolinium), which is contained in the mixture of the silicon atom source and the carbon atom source must be controlled. These elements are strong determinants of the thickness of the resulting silicon carbide whisker. Yttrium, calcium, manganese, aluminium, indium, and rare earth elements are catalytic elements that facilitate thickening of the silicon carbide whisker. When the total amount of these elements reaches 100 ppm or more based on the amount of silicon atom in the mixture, the thickening effect is obtained. However, when the total amount exceeds 2000 ppm, the resulting silicon carbide whisker tends to crook, and non-whisker granular silicon carbide separates. This of course will spoil the toughness of the whisker. Therefore, the total amount of the whisker-thickening elements ought to be from 100 to 2000 ppm based on the silicon content, or more preferably from 300 to 1000 ppm.

Consequently, when the total amount of yttrium, calcium, manganese, aluminum, indium, and rare earth elements does not reach 100 ppm, a sufficient amount of one or more of these elements should be added so that the total amount becomes 100 ppm or greater; on the other hand, when the total amount of those elements exceeds 2000 ppm, an appropriate amount of one or more of those elements ought to be physically or chemically removed so that the total amount becomes not greater than 2000 ppm.

In the cases where those whisker-thickening elements are supplied from external sources to the carbon-atom source and/or silicon-atom source, there is no restriction as to the manner in which those elements are dosed: that is, those elements may be in the form of simple substance or in the form of water soluble salt such as chlorides and nitrides, e.g., $CaCl_2$, $YCl_2$, or water insoluble compounds such as oxides, e.g. $CaO.6H_2O$, $Y_2O_3$.

However, the supplemented whisker-thickening metal elements must be evenly distributed among the carbon-atom source and/or silicon-atom source. For example, a water soluble salt of a whisker-thickening element may be dissolved in water and this solution may be used to hydrolyze chlorodisilane or other silicon-atom sources to uniformly distribute the whisker-thickening element among the silicon-atom source.

An effective inclusion of the whisker-thickening element or compound among the carbon-atom source is also attained by preparing both of these entitles in powder form and mixing them together thoroughly. This procedure is especially helpful in cases where the compound of the whisker-thickening element is water insoluble such as oxides. In this procedure, the powder of the whisker-thickening element or compound should be as fine as possible for the purpose of obtaining a better mixing result.

Unlike the whisker-thickening catalytic elements listed, cobalt and nickel are known to thwart the thickening tendency of the whisker. When the total amount of cobalt and nickel amounts to 200 ppm or greater, based on silicon in the reaction system, the thickening tendency of the growing silicon carbide whisker may be thwarted; therefore, the total amount of cobalt and nickel in the reactants should be restricted to less than 200 ppm, or more preferably less than 100 ppm, based on the silicon amount.

A mixture of a source of silicon atom and a source of carbon atom, wherein the overall content of yttrium, calcium, manganese, aluminum, indium, and rare earth elements and the grain size of the source of silicone atom are adjusted according to the invention, results in the production of a silicone carbide whisker of sufficient thickness upon being heated and reacted. This reaction may be conducted in an atmosphere of an inert gas, but preferably, the reaction atmosphere consists of 1 to 100 volume % of hydrogen gas, with the balance being an inert gas. The inclusion of hydrogen gas in the reaction atmosphere is effective to improve the yield of silicon carbide whisker and to inhibit the creation of silicon carbide powder. Incidentally, since nitrogen gas reacts with silicon to form silicon nitride, it is desirable that nitrogen gas is not in the reaction atmosphere.

In the above procedure, the reaction temperature is preferably from 1400° to 1800° C., and more preferably from 1500° to 1700° C. When the temperature is lower than 1400° C., the reaction rate becomes too low, and no substantial reaction takes place; whereas when the temperature is higher than 1800° C., the creation of powdery silicon carbide as a by-product is enhanced.

According to the method of the invention, the source of silicon atom is prepared in the form of granules having a mean grain diameter of a predetermined range. If the mean diameter of the granular silicon-atom source is increased, the diameter of the resulting whisker tends to increase, but the reaction rate tends to decrease. As a result, the ratio of conversion of the silicon-atom source into silicon carbide decreases whereby the amount of residual unreacted silicon-atom source increases. It is therefore important that the mean diameter of the granular silicon-atom source be controlled at an appropriately small value within the predetermined range based on the desired whisker diameter.

The silicon carbide whisker thus obtained usually contains excessive carbon, so that it is desirable to remove extra carbon by placing the whisker in an air stream of a temperature between 600° C. and 800° C. Also, it is desirable to treat the whisker with hydrofluoric acid or the like so as to remove unreacted silicon-atom source.

The silicon carbide whisker having a mean diameter of 1 µm or greater as obtained through the method of the present invention is capable of imparting a high fracture toughness to a ceramic material when it is combined with the ceramic material to form a composite ceramic material.

As described above, by virtue of the features of the method of the invention, it has become possible to controllably obtain silicon carbide whisker having a diameter greater than 1 µm, or usually 1 to 7 µm, using the solid phase reduction method, which, although industrially advantageous, is otherwise unable to produce a whisker of a diameter greater than 1 µm. Also, since, according to the method of the invention, powdery silicon carbide is minimized as a by-product, it is possible to obtain highly crystallized thick silicon carbide whisker which has high fracture toughness, at a high yield and low production cost.

The following examples illustrate the invention.

In the following examples and comparative examples, the metallic elements were analyzed by means of ICP emission spectrochemical analysis. Also, the degree of the powder formation among the whisker in the produced silicon carbide was visually examined and given one of the five ranking points (Table D according to the degree of the relative amount of powdery silicon carbide in the product.

TABLE 1

| ESTIMATION | POINT |
| --- | --- |
| A small amount of powdery product exists. | 1 |
| More than small amount of powder exists. | 2 |
| About equal amounts of powder and whisker coexist. | 3 |
| Considerable amount of powder exists. | 4 |
| Whisker scarcely exists. | 5 |

[EXAMPLE 1]

Trimethylchlorodisilane [$(CH_3)_3Si_2Cl_3$] and dimethyltetrachlorodisilane [$(CH_3)_2Si_2Cl_4$] were distilled to the extent that the total content of nickel and cobalt became less than 5 ppm. Then, equal amounts of these silicon-atom sources were mixed together. This mixture in an amount of 108.9 g was poured into an appropriate amount of pure water in which 0.0743 gram of $YCl_3 \cdot 6H_2O$ was dissolved to thereby initiate hydrolysis. A white gel-like substance was obtained as a result of the hydrolysis, and this substance was dried until the moisture was thoroughly removed and a granular product of the hydrolysis (source of silicon atom) was left. The amount of yttrium based on the silicon atom in the hydrolysis product was 574 ppm and that of cobalt as well as that of nickel was 5 ppm or less.

Next, the granular hydrolysis product was pulverized and granulated by pressure, and then the granules were sieved to obtain granules of diameters from 100 to 150 µm; this procedure was repeated until all of the hydrolysis product was converted to granules having diameters from 100 to 150 µm. Eventually, a granular silicon-atom source in an amount of 60.7 g was obtained. Carbon black in an amount of 36 g as the carbon-atom source was mixed with this silicon-atom source, and the mixture was extensively stirred. Thereafter, the uniform mixture was placed in a furnace, and argon gas stream was passed through the furnace while the furnace temperature was raised to 1600° C. and kept there for two hours. Silicon carbide whisker was grown, and the furnace was allowed to cool down. The manufactured silicon carbide was allowed to oxidize in atmosphere air for one hour at 750° C. to remove the unreacted carbon black. Then, the substance was soaked in 50% hydrofluoric acid for one hour to remove the unreacted silicon-atom source.

After this, the weight of the reaction product (silicon carbide) was 16.8 g. The ratio of conversion of silicon atom in the hydrolysis product into silicon carbide was 42% as calculated from the content of the silicon atom in the hydrolysis product. The diameter of the silicon carbide whisker as manufactured was 3.5 µm, and the powder formation relative to the whisker formation was estimated to belong to the ranking 1. Therefore, in this example, it was possible to obtain thick whisker scarcely containing powdery by-product.

[EXAMPLE 2]

The same methylchlorodisilane mixture as prepared in Example 1 in an amount of 108.9 g was poured into pure water, hydrolyzed, and the reaction product was dried, pulverized and granulated in the same manner as in Example 1 to obtain granules of diameters from 100 to 150 µm.

These granules were mixed uniformly with 36 g of carbon black which uniformly contained 0.0743 g of powdery yttria having a mean grain diameter of 3 µm. (Like Example 1 the amount of yttrium based on the silicon atom in the hyodrolysis product was 574 ppm.) The mixture was heated in the same manner as in Example 1 to facilitate the reaction and thereafter the resultant silicon carbide whisker was subjected to oxidation in the atmosphere air for one hour at 750° C. to remove unreacted carbon black. Thereafter, the whisker was soaked in 50% hydrofluoric acid for one hour to remove unreacted silicon-atom source.

The resulting reaction product (silicon carbide) weighed 21.6 g, the conversion ratio was 54%, the mean diameter of the produced whisker was 2.7 μm, the ranking of powder formation estimation was 1. Therefore, in this example it was possible to obtain thick whisker scarcely containing powdery by-product.

[COMPARATIVE EXAMPLE 1]

The same methylchlorodisilane mixture as prepared in Example 1 in an amount of 108.9 g was poured into pure water in which 0.0743 g of $YCl_3.6H_2O$, and 0.0057 g each of CoClhd 2.6H$_2$O and $NiCl_2.6H_2O$ were dissolved to thereby initiate hydrolysis. A gel-like substance was obtained as a result of the hydrolysis, and this substance was dried until the moisture was thoroughly removed and a granular product of the hydrolysis (source of silicon atom) was left. The amounts of yttrium, cobalt, and nickel, based on the silicon atom in the hydrolysis product were respectively, 588 ppm, 48 ppm, and 53 ppm.

Next, the granular hydrolysis product was pulverized and sieved repeatedly until all granules had diameters less than 44 μm. This silicon-atom source was mixed with carbon black, and the mixture was heated to undergo a reaction. Thereafter, the unreacted carbon black and the unreacted silicon-atom source were removed in the same way as Example 1.

In the resulting reaction product (silicon carbide), the conversion ratio was 77%, and the ranking of powder formation estimation was 1. However, the mean diameter of the silicon carbide whisker was 0.7 μm, which is about one fifth of the diameter of the whisker obtained in Example 1.

[EXAMPLES 3-9]

In all of Examples 3 through 9, the same methylchlorodisilane mixture as prepared in Example 1 in an amount of 108.9 g was poured into pure water to be hydrolyzed, and the reaction product was dried, pulverized and granulated in the same manner as in Example 1 to obtain granules of grain diameters from 100 to 150 μm. Measured amounts of oxides of catalytic elements in the form of powder such that the respective content of each element in the reaction system based on the content of silicon atom would be as shown in Table 2 were prepared. In the case of Example 3, for example 500 ppm of Ca, 24 ppm of Co, and 51 ppm Ni were in the reaction system. The oxide powder was uniformly mixed with 36 g of carbon black, and this mixture was then uniformly mixed with the granular hydrolysis product. The thus obtained mixture was heated in the same manner as in Example 2 to facilitate the reaction and thereafter the unreacted silicon-atom source and the unreacted carbon black were removed in the hydrofluoric acid.

The features of the resultant silicon carbide whiskers of Examples 3 through 9 are shown in Table 2.

The results shown in Table 2 indicate that by including the oxide of calcium, manganese, aluminum, indium, celium, neodymium, or gadolinium in the reaction system, silicon carbide whisker of a mean diameter of as great as 6.8 μm can be obtained, while the formation of powdery product is minimized.

[EXAMPLES 10-17; COMPARATIVE EXAMPLE 2]

In all of Examples 10 through 17 and comparative Example 2, the same chlorodisilane mixture as prepared in Example 2 in an amount of 108.9 g was poured into pure water to be hydrolyzed, and the reaction product was dried, pulverized and granulated to obtain granules of a predetermined grain diameter range, e.g., 44–88 μm in the case of Example 12. As the catalyst, $YCl_3.6H_2O$, in the form of powder, was measured such that the Y content based on the content of silicon atom would be as shown in Table 3. This catalyst was uniformly mixed with 36 g of carbon black, and this mixture was then uniformly mixed with the granular hydrolysis product. The thus obtained mixture was heated to a temperature as indicated in Table 3 to facilitate the reaction and thereafter the unreacted silicon-atom source and the unreacted carbon black were removed in the hydrofluoric acid.

The features of the resultant silicon carbide whiskers of these examples are shown in Table 3. In the case of Comparative Example 2, silicon carbide whisker scarcely grew so that it was impossible to obtain the mean whisker diameter.

The results shown in Table 2 indicate that an over dosage of catalytic element thwarts growth of silicon carbide whisker.

TABLE 2

| Example No. | Mean Grain Diameter of Source of Silicon Atom (μm) | Catalysts | Contents (ppm) Catalytic Element/Si | Co/Si | Ni/Si | Silicon Conversion Ratio (%) | Mean Diameter of Whisker (μm) | Esitmation of Formation of Powdery Silicon Carbide |
|---|---|---|---|---|---|---|---|---|
| 3 | 100–150 | CaO | 500 | 24 | 51 | 51 | 4.4 | 1 |
| 4 | 100–150 | $MnO_2$ | 1000 | 35 | 88 | 49 | 3.4 | 2 |
| 5 | 100–150 | $Al_2O_3$ | 200 | 77 | 80 | 38 | 5.0 | 1 |
| 6 | 100–150 | $InO_2$ | 1500 | 30 | 50 | 41 | 6.8 | 2 |
| 7 | 100–150 | $CeO_2$ | 1000 | 17 | 55 | 44 | 4.2 | 1 |
| 8 | 100–150 | $Nd_2O_3$ | 750 | 50 | 81 | 48 | 3.2 | 2 |
| 9 | 100–150 | $Gd_2O_3$ | 900 | 88 | 79 | 39 | 3.3 | 1 |

TABLE 3

| Example No. | Temperature (°C.) | Mean Grain Diameter of Source of Silicon Atom (μm) | Catalyst | Contents (ppm) Y/Si | Co/Si | Ni/Si | Silicon Conversion Ratio (%) | Mean Diameter of Whisker (μm) | Estimation of Formation of Powdery Silicon Carbide |
|---|---|---|---|---|---|---|---|---|---|
| 10 | 1400 | 100–150 | $YCl_3.6H_2O$ | 500 | 65 | 47 | 29 | 1.1 | 1 |
| 11 | 1800 | 100–150 | $YCl_3.6H_2O$ | 500 | 65 | 47 | 85 | 4.3 | 2 |
| 12 | 1600 | 44–88 | $YCl_3.6H_2O$ | 500 | 65 | 47 | 62 | 1.2 | 1 |

TABLE 3-continued

| | Temperature (°C.) | Mean Grain Diameter of Source of Silicon Atom (μm) | Catalyst | Contents (ppm) | | | Silicon Conversion Ratio (%) | Mean Diameter of Whisker (μm) | Estimation of Formation of Powdery Silicon Carbide |
|---|---|---|---|---|---|---|---|---|---|
| | | | | Y/Si | Co/Si | Ni/Si | | | |
| 13 | 1600 | 420–710 | YCl$_3$.6H$_2$O | 500 | 65 | 47 | 39 | 4.3 | 1 |
| 14 | 1600 | 710–1000 | YCl$_3$.6H$_2$O | 500 | 65 | 47 | 45 | 4.9 | 2 |
| 15 | 1600 | 100–150 | YCl$_3$.6H$_2$O | 400 | 107 | 77 | 57 | 3.1 | 1 |
| 16 | 1600 | 100–150 | YCl$_3$.6H$_2$O | 50 | 41 | 48 | 62 | 2.8 | 1 |
| 17 | 1600 | 100–150 | YCl$_3$.6H$_2$O | 1900 | 55 | 90 | 71 | 1.8 | 2 |
| Comparative Example | | | | | | | | | |
| 2 | 1600 | 100–150 | YCl$_3$.6H$_2$O | 2500 | 45 | 50 | 51 | unmeasureable | 4 |

What is claimed is:

1. In a method for manufacturing silicon carbide whisker wherein a mixture of a silicon atom source and a source of carbon atom is caused to undergo a reaction to grow silicon carbide whisker, the improvement which comprises
   (a) said silicon atom source being in the form of grains having a mean grain diameter of 50 μm or greater, and
   (b) carrying out the reaction in the presence of a catalyst comprising at least one element or compound thereof, said element being selected from the group consisting of yttrium, calcium, manganese, aluminum, indium, and rare earth elements, the total content of said element or compound being adjusted to be from 100 to 2000 ppm based on the silicon content of the mixture, so as to maintain the cross-sectional diameter of the whisker produced to greater than about 1 μm.

2. The method of claim 1 wherein the mean grain diameter of said silicon atom source is from about 50 μm to 1000 μm.

3. The method of claim 1 wherein the mean grain diameter of said silicon atom source is from about 100 μm to 500 μm.

4. The method of claim 1 wherein the overall amount of said element(s) is from about 300 to 1000 ppm.

5. The method of claim 1 wherein a water insoluble compound of said element is added to said mixture.

6. The method of claim 1 wherein an oxide of said element is added to said mixture.

7. The method of claim 1 wherein the silicon atom source is obtained by hydrolyzing a compound selected from the group consisting of R$_a$SiCl$_{4-a}$; and R$_b$Si$_2$Cl$_{6-b}$; where R is hydrogen or a monovalent hydrocarbon group, and a and b are integers such that $0 \leq a \leq 3$ and $1 \leq b \leq 5$.

8. The method of claim 7 wherein the compound is selected from the group consisting of CH$_3$SiCl$_3$, (CH$_3$)$_2$SiCl$_2$, (CH$_3$)$_3$SiCl, (CH$_2$=CH)SiCl$_3$, C$_6$H$_5$SiCl$_3$, HSiCl$_3$, H$_2$SiCl$_2$, SiCl$_4$, (CH$_3$)Si$_2$Cl$_5$, (CH$_3$)$_2$Si$_2$Cl$_4$, (CH$_3$)$_3$Si$_2$Cl$_3$, and (C$_6$H$_5$)$_3$Si$_2$Cl$_3$.

9. The method of claim 1 wherein the source of carbon atom is carbon black or powdery activated carbon.

10. The method of claim 1 wherein the reaction is carried out in an atmosphere of from 1 to 100 volumes percent hydrogen with the balance being an inert gas other than nitrogen.

11. The method of claim 1 wherein the reaction is carried out at a temperature of from about 1400° to 1800° C.

12. The method of claim 1 which further comprises removing unreacted carbon from the product whisker by placing said whisker in an air stream at a temperature of from 600° to 800° C.

13. The method of claim 1 wherein unreacted silicon is removed from said whisker product by treating said whisker with an acid.

14. The method of claim 13 wherein the acid is hydrofluoric acid.

15. The method of claim 1 wherein the mixture contains less than about 200 ppm based on the silicon content of an impurity selected from the group consisting of cobalt, nickel, and combinations thereof.

16. The method of claim 1 wherein the source of carbon is selected from the group consisting of carbonaceous materials, and carbonizable materials.

17. The method of claim 16 wherein the easily carbonized material is a phenolic resin.

18. The method of claim 15 wherein the carbonaceous material is carbon black.

* * * * *